(12) United States Patent
Geren

(10) Patent No.: US 10,243,532 B1
(45) Date of Patent: Mar. 26, 2019

(54) DIGITIZED AUTOMATIC LEVEL CONTROL TRANSDUCER-CALIBRATOR

(71) Applicant: David K. Geren, Canoga Park, CA (US)

(72) Inventor: David K. Geren, Canoga Park, CA (US)

(*) Notice: Subject to any disclaimer, the term of this patent is extended or adjusted under 35 U.S.C. 154(b) by 0 days.

(21) Appl. No.: 15/208,599

(22) Filed: Jul. 12, 2016

(51) Int. Cl.
  H03G 7/00 (2006.01)
  H03G 3/30 (2006.01)
  H03F 3/183 (2006.01)
  H03G 11/04 (2006.01)

(52) U.S. Cl.
  CPC ........... H03G 3/3005 (2013.01); H03F 3/183 (2013.01); H03G 11/04 (2013.01); *H03F 2200/03* (2013.01)

(58) Field of Classification Search
  CPC ........ H03G 3/3005; H03G 11/04; H03G 7/00; H03F 3/183; H03F 2200/03
  See application file for complete search history.

(56) References Cited

U.S. PATENT DOCUMENTS

| 4,514,703 | A | * | 4/1985 | Maher | ........................ | H03G 1/00 330/134 |
| 5,794,187 | A | * | 8/1998 | Franklin | .................... | H04B 1/64 381/316 |
| 6,324,229 | B1 | * | 11/2001 | Browder | ................ | H03G 3/001 375/345 |
| 6,741,124 | B2 | | 5/2004 | Lucas | | |
| 7,061,669 | B2 | | 6/2006 | Nakashima et al. | | |
| 7,212,640 | B2 | * | 5/2007 | Bizjak | .................. | H03G 3/3089 381/106 |
| 7,521,980 | B2 | | 4/2009 | Koen | | |
| 8,300,849 | B2 | | 10/2012 | Smirnov et al. | | |
| 8,447,256 | B2 | | 5/2013 | Hausmann et al. | | |
| 8,594,345 | B2 | | 11/2013 | Hess | | |
| 8,917,886 | B2 | | 12/2014 | Grove | | |

* cited by examiner

*Primary Examiner* — Andrew L Sniezek
(74) *Attorney, Agent, or Firm* — James E. McTaggart

(57) ABSTRACT

A microprocessor-based ALC (automatic level control) system, for original manufacture or field maintenance and retrofit, providing the stability, reliability and longevity of digital solid state implementation along with ALC characteristics calibrated to one or more programed sets of ALC performance specifications. The ALC system can be embodied as a professional audio ALC amplifier with a purely analog main signal path including an ECA (Electronically Controlled Attenuator) controlled by a highly stable microprocessor-based signal level transducer, an ALC calibrator that can be incorporated into any system, ALC system or ALC-related module thereof, or deployed as stand-alone test equipment, to provide ALC performance and/or automatic recalibration of existing ALC circuitry, compensating components thereof to meet programed ALC performance specifications and thus remedy problems and shortcomings relating to stability, reliability, longevity and/or ALC performance.

12 Claims, 5 Drawing Sheets

DIGITIZED AUTOMATIC LEVEL CONTROL TRANSDUCER-CALIBRATOR

FIELD OF THE INVENTION

The present invention is in the field of ALC (automatic level control) of electrical signals as utilized through the full spectrum thereof and more particularly as practiced in the field of professional audio, directed to recording and broadcasting.

BACKGROUND OF THE INVENTION

The role of ALC in electronics is to regulate the varying input signal level in a controlled manner keeping it within acceptable boundaries (compression) and limits (limiting). While the present invention is primarily intended to apply to audio signals, its principals can be practiced at frequencies ranging from sub-sonic through radio frequency (r.f), microwave, as well as light.

Audio ALC is essential for recording studios to keep the signal within acceptable limits as well as being an artistic tool. It is essential in broadcasting to keep the signal level from exceeding proper limits thereby preventing overmodulation of transmitters, and can be used to make audio material seem louder without exceeding the maximum signal capabilities of the systems prior to the transmitter. ALC is also used to adjust signal levels where the program material may vary in average level to make it more uniform, thereby making it possible to operate either in an entirely automatic mode or in conjunction with a person "gain riding" the level controls.

DISCUSSION OF KNOWN ART

Typically ALC is incorporated into an amplifier in the form of an ALC loop stage wherein an ECA (Electronically Controlled Attenuator) is controlled by an SLT (Signal Level Transducer). A quest for optimal performance and stability spawned a wide range of approaches in the design of the ALC loop stage utilizing analog devices such as remote-cutoff vacuum tubes, photocells, field effect transistors, photo-transistors, analog multipliers (i.e. Gilbert cell), and photo-field effect transistors. Advancements in digital technologies now enable an entire ALC amplifier to be implemented digitally for improved stability, particularly in the ALC loop stage, with expected high accuracy calibrated shaping of the transfer function curve-shapes and time constants. However the audio signal paths remain controversial; many audio professionals and engineers in recording and broadcasting still prefer to work with analog signal paths due to perceived shortcomings in fidelity and accuracy of digitized information, sample rate trade-offs, and time latency before processing is completed.

One approach to audio ALC was the Teletronix LA-2A, which employed a photocell driven by a light emitting electroluminescent panel, being an example of how audio ALC may be accomplished using analog circuitry in the SLT (Signal Level Transducer). U.S. Pat. No. 3,258,707, filed in 1962, issued Jun. 28, 1966 to J. F. Lawrence Jr. for VARIABLE GAIN AMPLIFIER SYSTEM USING SOLID ELECTROLUMINESCENT CELL. A technical dissertation entitled "An Improved Method of Audio Level Control for Radio Broadcasting" by James F. Lawrence Jr., Teletronix Division of Babcock Electronics Corp., including a review of the operation of compressors and limiters and a description LA-2A leveling amplifier, was published in the Aug. 1964 Journal of the SMPTE (Society of Motion Picture and Television Engineers) Volume 73.

While possibly offering desirable signal compression/limiting transfer functions, the SLTs described above have drift and stability issues. The LA-2A also is inherently unstable due to drift in its SLT components over time and temperature change. The LA-2A User Operating Manual, published around 1969 by UREI, states: "The heart of the LA-2A (and its first successor, the solid state LA-3A) is the T4B Electro-Optical Attenuator. This plug-in assembly utilizes an Electro-Luminescent light source, which will deteriorate with usage. . . . When significant changes are noticed in PEAK REDUCTION control settings to achieve a certain amount of gain reduction (based on previous experience) the T4B is probably due for replacement. In normal daily usage, this should not occur sooner than 3 or 4 years."

Each SLT has its own inherent signal response characteristic. Hence, each will affect the signal levels in its own individual manner.

There remains a need for a means to obtain stable, repeatable, and low-maintenance ALC. This should be able to either replicate the response characteristics of a given compressor or limiter and its SLT, or such other set(s) of characteristics that are desired to be employed specifications.

OBJECTS OF THE INVENTION

It is a primary object of the present invention to provide an ALC system of highly stable and reliable electronic circuitry for use in the design and manufacture of high performance ALC systems, and for the field modification for remedial upgrading of existing ALC systems.

It is a further object to utilize solid state digital technology for benefits of high stability, reliability and longevity that are inherently lacking in ALC systems that utilize analog elements in the ALC loop.

It is a further object to keep the main audio signal path through the SLT to the associated main system as purely analog, free of digital content, for purposes of preserving overall status as an analog ALC system in the case of the associated main system being analog, e.g. using vacuum tubes or transistors.

It is a further object, to utilize the ALC system adapted to function as an ALC calibrator for incorporation into an existing ALC system, providing automatic ALC re-calibrations including required ALC component compensation.

SUMMARY OF THE INVENTION

The above-stated objects have been met by the disclosed microprocessor-based ALC loop stage (" microprocessor" in this disclosure is intended to further include computing devices such as microcontrollers, or digital signal processors) forming a microprocessor-based ALC (Automatic Level Control) system, for original manufacture or field retrofit, providing the stability, reliability and longevity of digital solid state implementation along with high level virtual ALC performance calibrated to one or more programmed sets of ALC performance specifications. The ALC system can be embodied as a microprocessor-based ALC transducer/attenuator loop stage, ALC system or ALC calibrator that can be incorporated into any system, ALC system or ALC-related module thereof, or deployed as a stand-alone test equipment setup, to provide ALC performance and/or recalibration (manual or automatic) of existing ALC circuitry, compensating components thereof to meet programed ALC performance specifications and thus remedy problems and shortcomings relating to stability, reliability, longevity and/or ALC performance.

BRIEF DESCRIPTION OF THE DRAWINGS

The above and further objects, features and advantages of the present invention will be more fully understood from the following description taken with the accompanying drawings in which.

DETAILED DESCRIPTION

Figure 1:
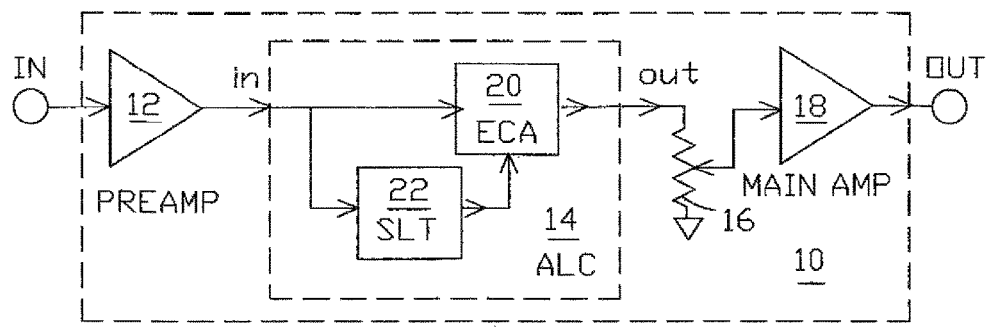
FIG. 1 is a block diagram illustrating the theory of a hypothetical ALC amplifier system for tutorial purposes as applied to the present disclosure.

FIG. 1 is a block diagram for the tutorial purpose of illustrating ALC theory as applied to the present disclosure. A hypothetical ALC amplifier 10 has a main analog signal path from preamplifier 12 thru ALC loop stage 14 to a user gain control potentiometer 16 at the input of the main output amplifier 18. Within the ALC loop stage 14 the signal path splits into two branches of the control loop: an attenuator branch thru ECA 20 and a transducer branch wherein SLT 22 detects the signal level and transduces the detected level into a control input applied to ECA 20 which enables ALC performance by adjusting the attenuation according to a desired transfer function.

Figure 2:
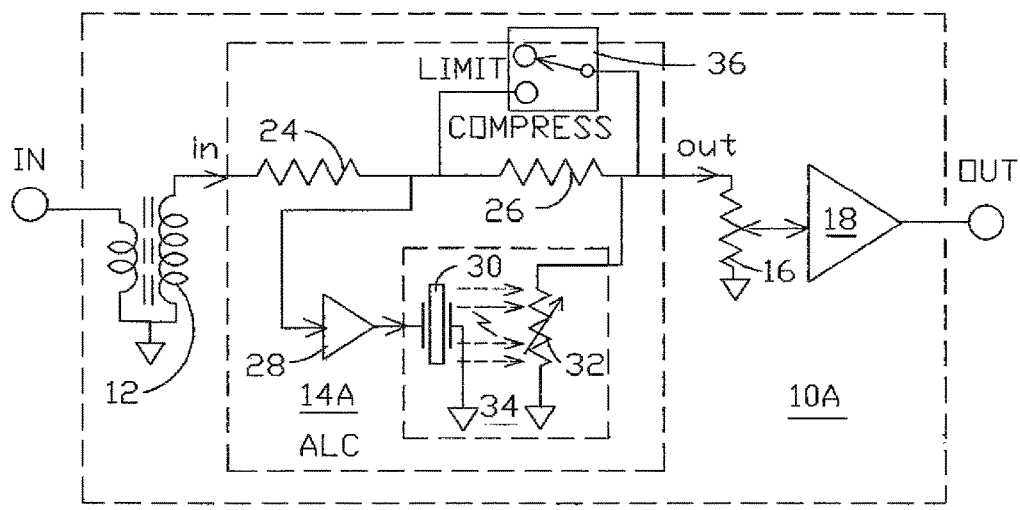
FIG. 2 is a schematic diagram of a known type of ALC amplifier that utilizes a photocell-based Audio Optical Isolator (AOI) in its ALC loop stage.

FIG. 2 is a schematic diagram of a known professional audio leveling amplifier 10A, known as Model LA-2A, which, as described above, exemplifies a totally analog vacuum tube/OCI implementation, recognized as a standard of professional audio ALC performance. At the input, pre-amplifier stage 12 (FIG. 1) is implemented by an audio step-up transformer 12' driving resistors 24 and 26 in series in the attenuator branch, and, in the transducer branch, via amplifier 28, driving a luminescent light source panel 30 which is optically coupled to a photo-resistive light sensor 32 whose resistance varies responsive to variations in input signal level.

Light sensor 32 functions in conjunction with both branches of the control loop. In the transducer branch it receives signal level information optically, and in the attenuator branch it co-operates with resistors 24 and 26 in series to form a variable voltage divider that performs the function of ECA 20, (FIG. 1), i.e. electronically controlled attenuation, receiving an "electronic control" input signal in the form of the varying resistance of light sensor 32. Light source panel 30 and light sensor 32 are packaged in an OCI 34, a replaceable module known as the T4B "Electro-Optical Attenuator".

Figure 6:
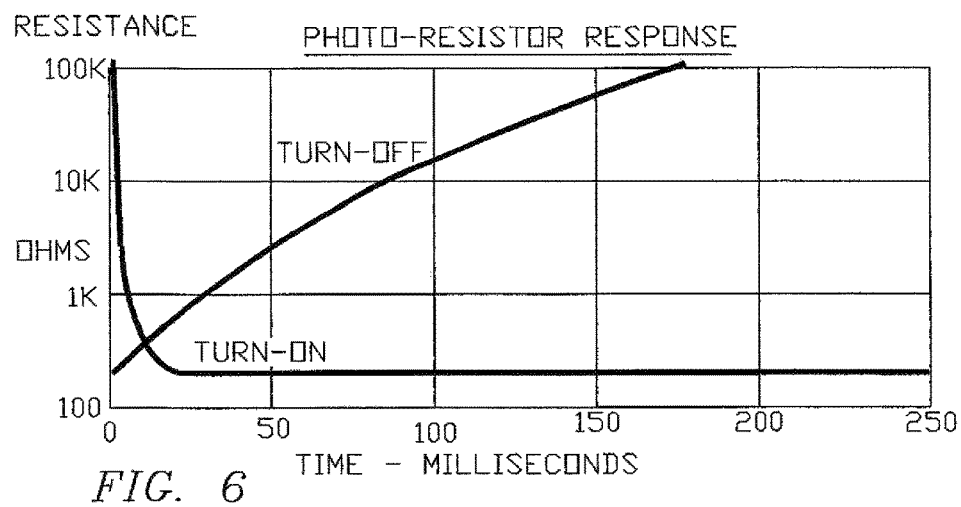
FIG. 6 is an illustrative graph showing ALC turn-on and turn-off response time curves representing performance of some professional audio ALC systems employing a photocell-based AOI.

The photo-resistive type of light sensor 32 in this example is selected for its ability to respond rapidly to capture the fast turn-on of luminescent light source panel 30, followed by a gradual recovery over a much longer turn-off time (refer to FIG. 6). A LIMIT-COMPRESS switch 36 connected across resistor 26 in the variable attenuator section 14A enables user selection between limiting mode (curve C, FIG. 7) with switch 36 open and compressor mode (curve D, FIG. 7) with switch 36 closed.

Figure 3:
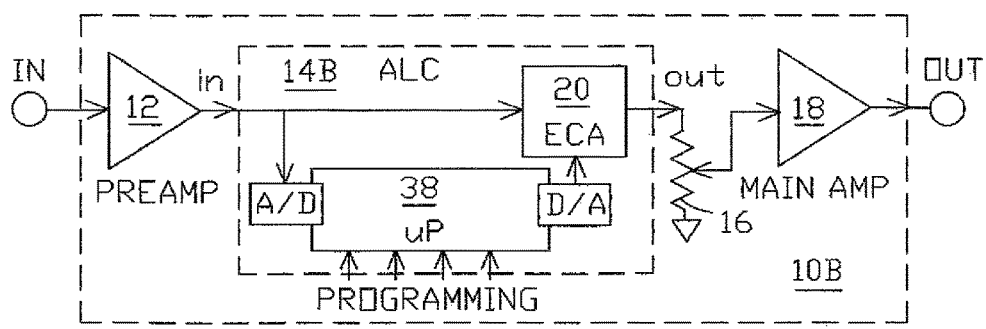
FIG. 3 is a functional block diagram and partial schematic of an ALC amplifier system of the present invention utilizing a microprocessor in the transducer branch of its ALC loop stage.

FIG. 3 is a functional block diagram of an ALC amplifier 10B of the present invention, based on FIG. 1 with SLT 22 implemented as a microprocessor 38 appropriately programmed including at least a primary set of ALC performance specifications and optionally programmed to perform manual and/or automatic self-calibration. ECA 20, preamplifier 12 and main output amplifier 18, may be implemented either using solid state digital technology, or using analog technology, e.g. using tubes, transistors or ICs (integrated circuits) in anticipation of market demands to preserve purely analog status for the main audio signal path through the ALC amplifier 10B.

Optionally, the transducer function of SLT 22, FIG. 1 in the transducer circuit branch may be made selectable from analog, solid state digital or microprocessor-based technology. However since analog devices used in SLTs, e.g. optical devices, are known to be prone to drift in ALC characteristics, the microprocessor 38 may be programmed to compute offset data or functions from known drive levels to compensate the input and/or output levels of the transducer branch to bring the system back into calibration.

Figure 4:
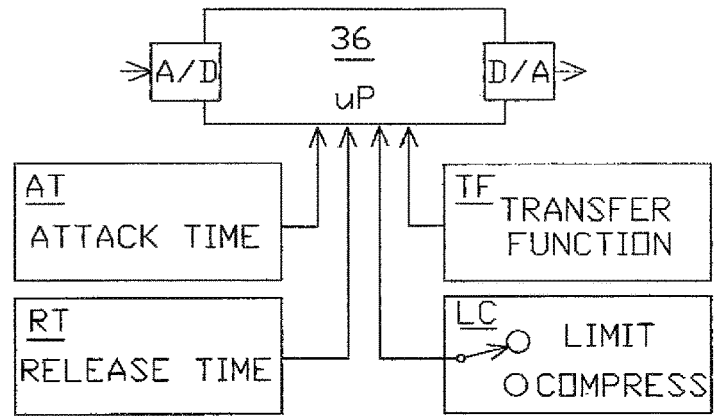
FIG. 4. depicts a version of the microprocessor of FIG. 3, programmed with a data base of lookup tables or mathematical formulas defining three main parameters of a primary set of performance specifications.

FIG. 4 depicts basic programming blocks applicable to the data base of microprocessor 38 (as in FIG. 3), including a primary set of performance specifications comprising lookup tables or formulas for three main parameters: attack time AT, release time RT and transfer function TF. A user switch LC, being any interface between the invention and the user, enables selection between the normal operation in limiter mode and alternative operation in compressor mode (which may also incorporate limiting functions), setting the transducer transfer function accordingly (see FIG. 7 and description thereof).

Figure 5:
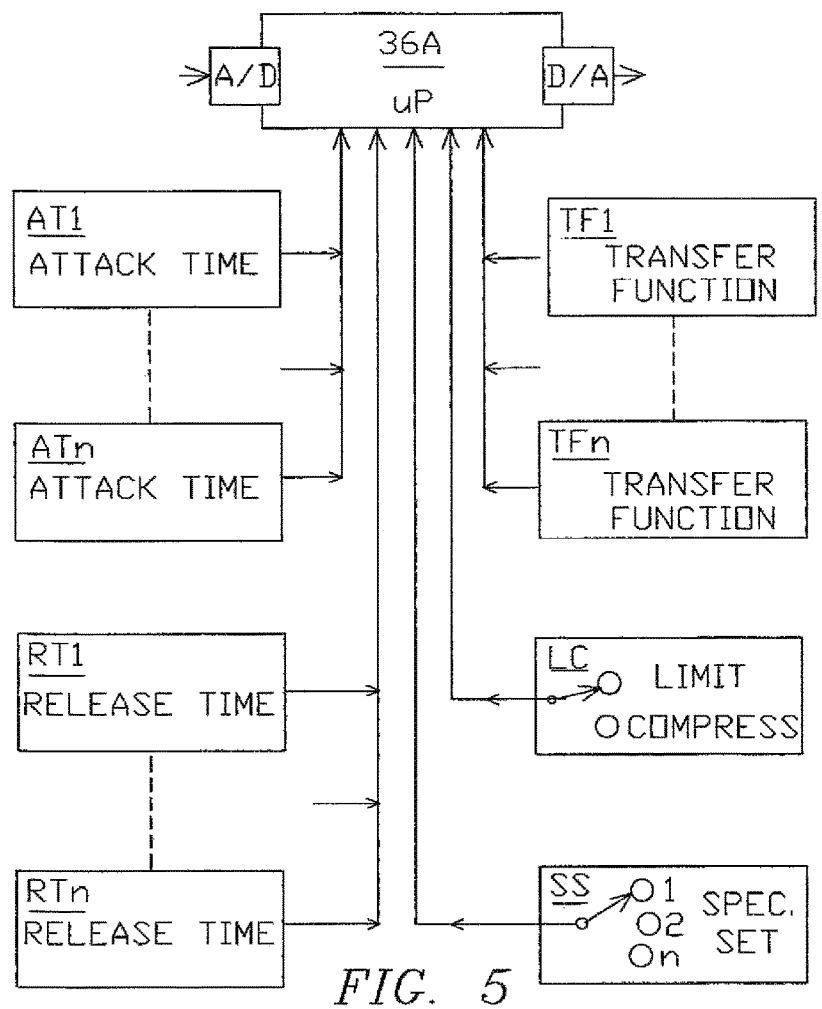
FIG. 5 depicts a version of the microprocessor of FIG. 4, further programmed to provide user selection from plural sets of performance specifications.

FIG. 5 depicts microprocessor 38A, substantially similar to microprocessor 38 of FIG. 4, further programmed with multiple sets of different ALC performance specifications from which a user is enabled to select from, 1, 2 . . . n as shown, for ALC operation.

FIG. 6 is a graph showing an example of TURN-ON and TURN-OFF response time curves relating to ALC amplifier calibration specifications programed into microprocessor-based ALC-related systems of the present invention. In the audio field of endeavor, the ALC turn-on time (a.k.a. attack time) is a key parameter that is typically much shorter than the turn-off time (release time).

Figure 7:
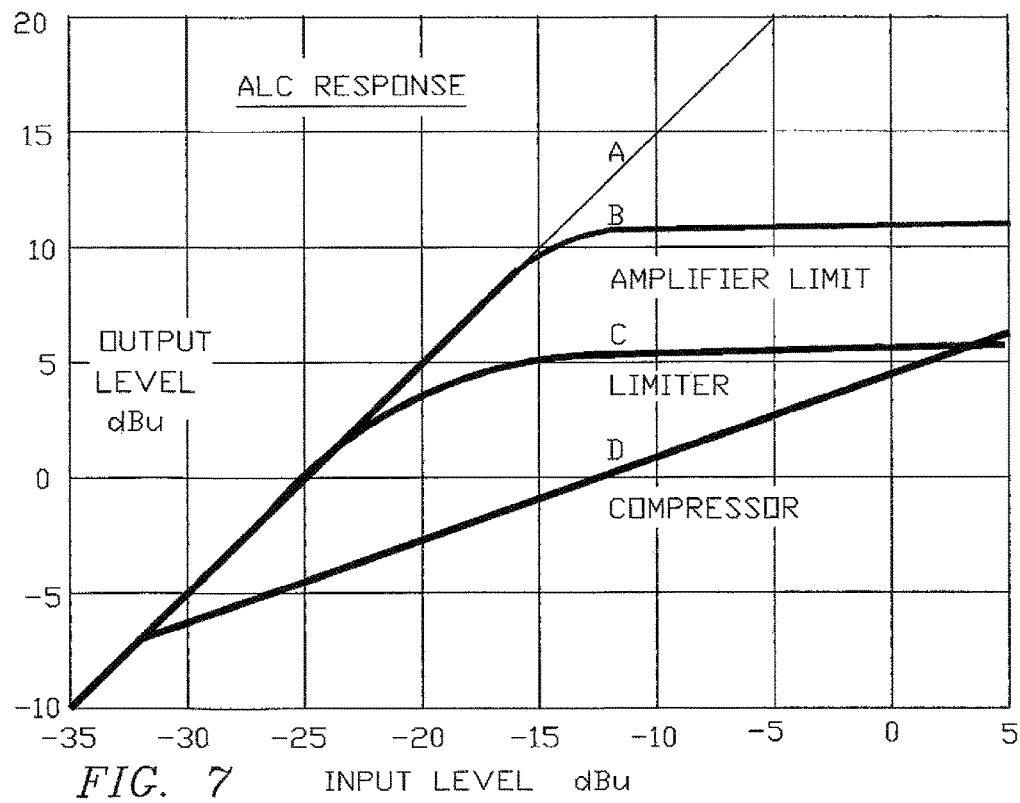
FIG. 7 is a an illustrative graph showing a set of ALC system output response curves, as a function of input level, representing desired ALC performance of professional audio ALC systems.

FIG. 7 is a graph showing a typical set of audio amplifier output response curves A-D, as a function of input level ranging from −35 dBu to +5 dBu, relating to ALC amplifier leveling modes and calibration specifications programed into microprocessor-based ALC-related systems of the present invention.

Line A, at 45 degrees inclination, represents the linear directly proportional response of a basic system with +25 dB gain, operating in a non-leveling mode. The linearity of line A shows that there is no output limitation within the 30 dB range of input level shown delivering +20 dBm output at −5 dBu input level. This linearity would continue on up to a threshold of some form of limitation, e.g. up to +0 dBu output at +5 dBu input, providing the full 40 dB (5 dBu −35 dBu) working range encompassed by the graph. The low end of line A, shown at −35 dBu input level, represents the designated low end of a working range, below which there is "footroom" allowed as a margin above background noise.

Curve B follows line A up to a point of departure at a system limit threshold at approximately +11 dBu output imposed either (a) with regard to equipment driven from the ALC system e.g. for recording or broadcasting, or (b) by hard limiting due to overloading the amplifier's maximum power output capability, resulting in unacceptable severe audio distortion that intensifies with further increase in input level. Consequently, without ALC, the working range of input level is restricted to about 20 dB (−15 dBu −35 dBu), Curve C, with the Invention in limiter only mode, follows line A up to a point of diversion into a wide threshold region extending from −23 dBu to −13 dBu, above which high ALC loop gain continuously increases attenuation (vertical distance between curve B and line A) almost directly proportional the increasing input level, in full limiting mode that holds the output response curve C substantially horizontal at about +6 dBu for further increasing input levels up to (and beyond) the +15 dBu high end shown, providing a working range of at least the 40 dB shown and reserving a margin of about 6 db headroom from the onset of hard limiting and severe distortion at curve B above.

Compression ratio Rc, a.k.a. loop gain, at any point on the response curves of FIG. 7, is equal to 1−slope=1−rise/run. Thus, for slopes ranging from 0 (horizontal) to 1 (line A: 45 degrees) the corresponding compression ratio Rc ranges from 1 to 0, and can be readily calculated graphically from the slope at any point on any of the response curves by triangulating the slope trigonometrically. For Curve D (user-switched to compressor mode) as shown, the compression ratio Rc is calculated as a percentage to be 64%.

Curve D is characterized by a wide threshold region within which ALC operates as a compressor with compression ratio Rc transitioning smoothly from near 0% at −23 dBu and below, increasing smoothly to near 100% at (approx.) 11 dBu input level and above, thus occupying a wide portion (approx. 12 dB) of the (approx.) 40 dB input working range and contributing to a smooth overall quality of ALC performance that is unique and highly valued in the professional audio field of endeavor.

The microprocessor-based ALC system disclosed above for ALC systems can be readily adapted to create a stand-alone test instrument capable of performing engineering type measurements of performance parameters of an ALC system as an alternative to guesswork or the task of having to procure, assemble and set up the required group of precision audio test equipment, if available, and performing a set of time-consuming measurements regarding conformance to a set of specifications to assess need for remedial action such as setup adjustments, operating procedure alterations and/or component replacements. Remedial action typically needs to be followed up by recalibration to specifications utilizing the test equipment.

The compactness of the microprocessor technology makes it feasible to incorporate a microprocessor-based ALC calibration system of the present invention for purposes of improvement particularly as needed for ALC system types or models known to have chronic inherent stability and reliability problems as described above.

Figure 8:
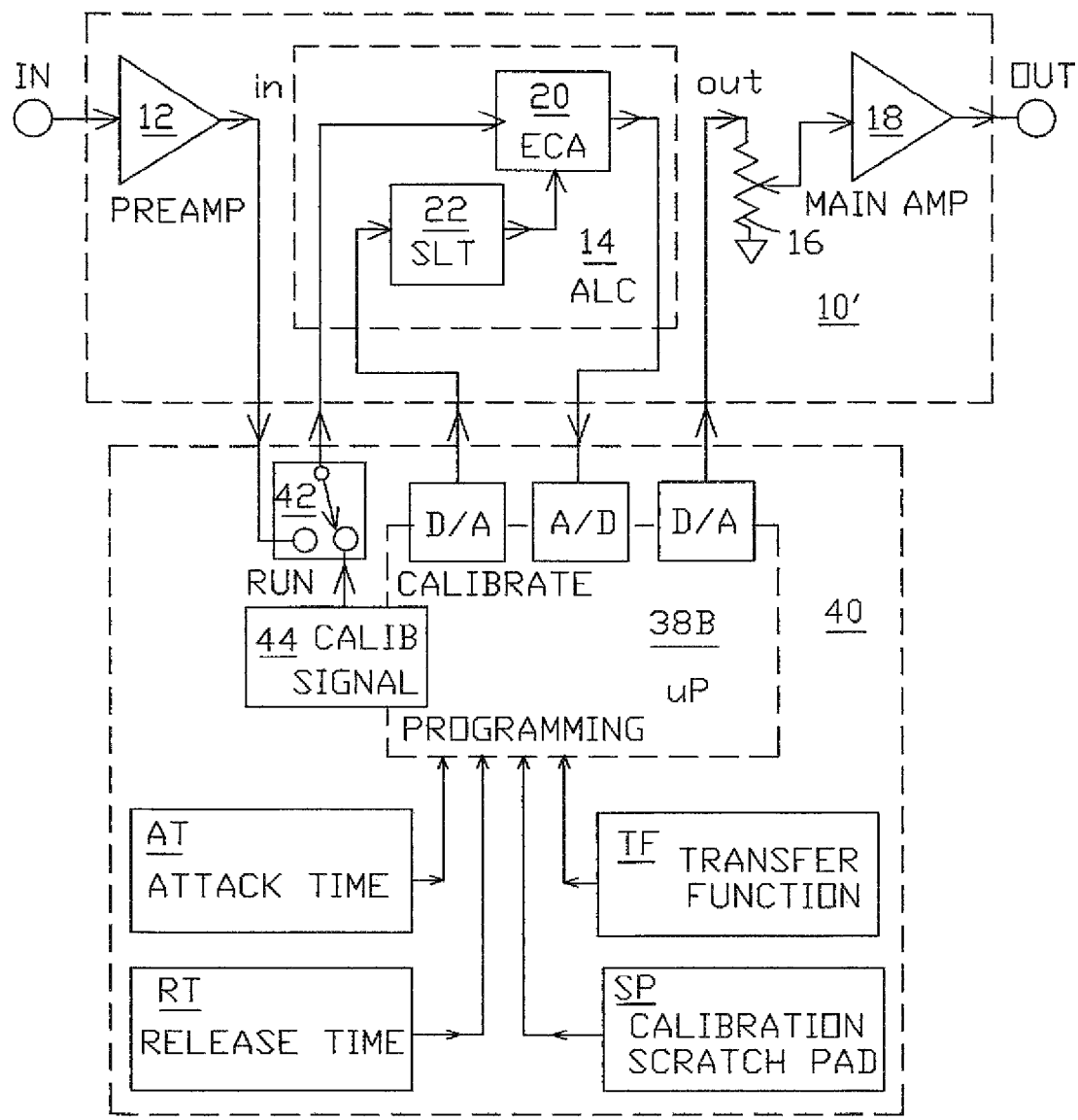
FIG. 8 is a functional block diagram showing a microprocessor-based ALC calibrator of the present invention operationally interconnected to the generic ALC amplifier as shown in FIG. 1.

FIG. 8 is a functional block diagram showing a microprocessor-based ALC calibrator 40 of the present invention operationally interconnected to and optionally integrated with an existing ALC amplifier 10', a version of the generic ALC amplifier 10 in FIG. 1, slightly modified to allow signal injection from calibrator 40 at the input and/or output port of the ALC amplifier's ALC loop stage 14 as required for calibration and compensation purposes. Microprocessor 38B, a modified version of microprocessor 38A of FIG. 4, is programmed to perform ALC recalibration to a primary set of performance specifications including the lookup table data blocks shown for key parameters: attack time AT, release time RT and transfer function TF, as in FIG. 4. A RUN-CALIBRATE switch 42 redirects the input ALC loop stage 20 from the received signal (preamp 12) to a calibration signal generator 44 which may be synthesized in microprocessor 38B or provided separately.

Figure 9:
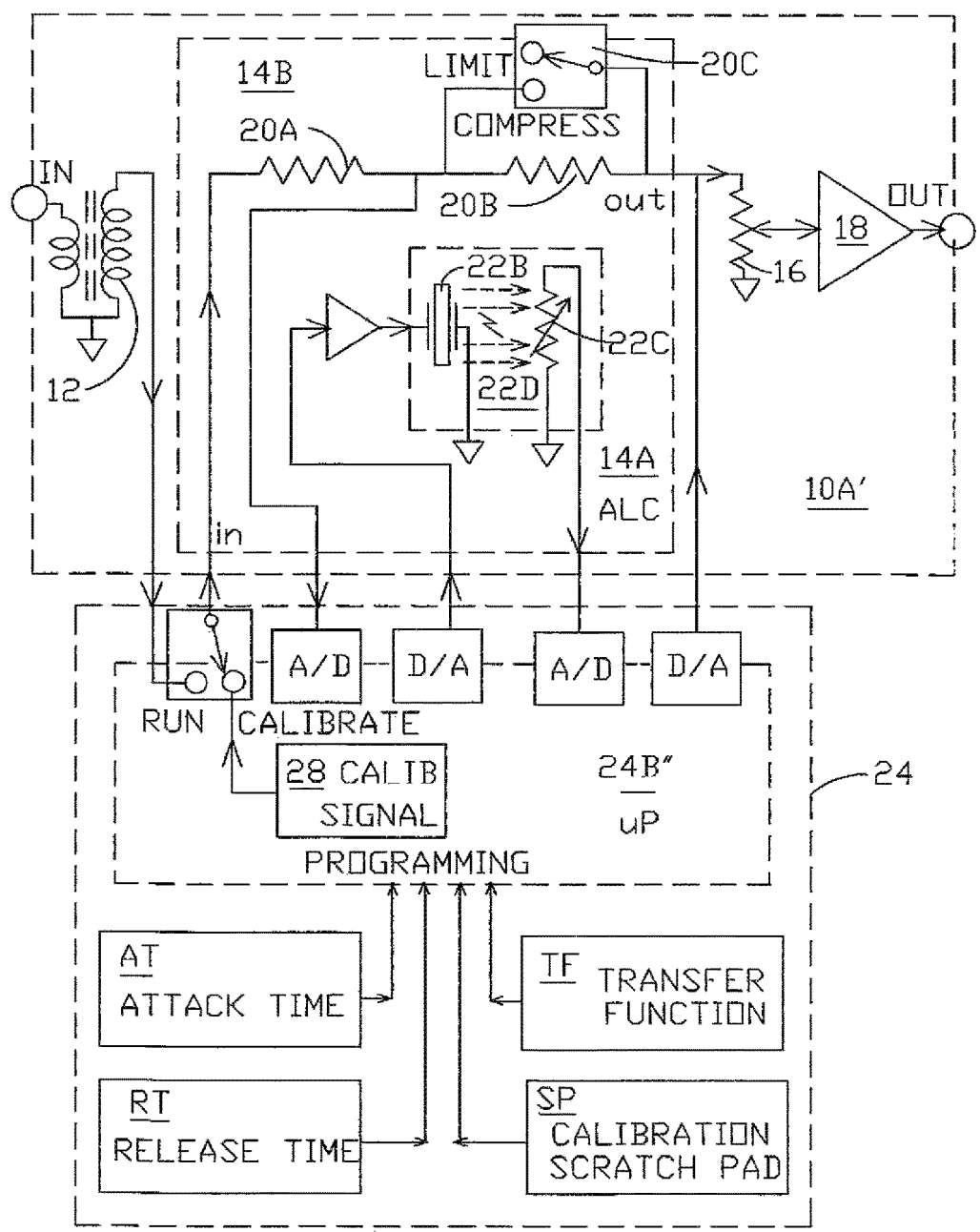
FIG. 9 is a functional block diagram showing a microprocessor-based ALC calibrator of the present invention operationally interconnected to an AOI type ALC amplifier as in FIG. 2.

FIG. 9 is a functional block diagram showing a microprocessor-based ALC calibrator 40A of the present invention operationally interconnected to and optionally integrated with an existing ALC amplifier 10A', a version of the known AOI type ALC amplifier 10A shown in FIG. 2, slightly modified to allow signal injection from calibrator 40A at the input and/or output port of the ALC loop stage 14A of ALC amplifier 10A' as required for calibration and compensation purposes. In this version, calibrator 40A and microprocessor 38C are substantially similar to calibrator 40 and microprocessor 38B shown in FIG. 8 and described in connection therewith, accomplishing automatic ALC self-recalibration that compensates the (analog) components driver amplifier 28 and replaceable module 34 i.e. the T4B "Electro-Optical Attenuator", which contains the luminescent light panel source 30 and the opto-resistive light sensor 32.

Regarding the calibration systems of FIGS. 8 and 9, these can be modified to provide user-selectable multiple performance specification sets by following the example of microprocessor 38A shown and described in connection with FIG. 5.

External potentiometers, switches, rotary encoders, or other computers or microprocessors etc. can be used to control the microprocessor in a microprocessor-based ALC system or calibrator of the present invention to establish Attack, Release, Compression, Limiting, Leveling, and any combination thereof. Other functions of the microprocessor could be similarly called up in a continuously variable manner. Furthermore, the microprocessor may be fully controlled in every way through one or more Digital Control ports (pairs of converters: a D/A and an A/D, as in FIGS. 3-5, 8 & 9). One or more of these Digital Control ports can also be used to re-program the microprocessor.

A substitute replacement for the replaceable module 22A can be provided by a compatible replacement module incorporating an ALC system of the present invention: either (a) a calibrator in conjunction with AOI e.g. as in FIG. 9, or (b) microprocessor ALC circuitry as in FIG. 3 programmed as in FIG. 4 or 5.

Although all of the embodiments disclosed represent ALC systems of the present invention can be practiced in conjunction with any type of main audio system whether solid state or vacuum tube type, analog or digital, the audio signal path through the ALC loop stage is kept purely analog for marketing purposes: to facilitate the preservation of special characteristics of analog status of ALC amplifiers favored by many end users.

The principles and techniques of the invention, as disclosed above in connection with illustrative embodiments operating at audio frequency, can be readily adapted and practiced in a wide range of ALC systems and devices including ALC systems and calibrators operating at frequencies throughout the full energy spectrum including sub-audio, audio, ultrasound, r.f., microwave, terahertz, and light.

Any embodiment of the invention can be readily adapted to connect to any external ALC system and perform as a test equipment setup for ALC evaluation and calibration thereof.

The invention may be practiced with other implementations, variations and alternatives that fall within the spirit and essential characteristics of the invention. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. A digitized ALC (Automatic Level Control) transducer-calibrator, comprising:
    a digital computing device, selected from a group including a microprocessor, a microcontroller and a digital signal processor, including an A/D (analog to digital) converter, enabled to convert an analog input signal into digital data input to be processed by said computing device, and a D/A (digital to analog) converter, converting digital data output from said computing device into an analog intermediate signal;
    an analog amplifier having a preamplifier stage receiving an analog source signal, an ALC loop stage containing said computing device driven from said preamplifier, and a main analog output amplifier driven by the analog intermediate signal from the ALC loop stage; and
    the ALC stage, including a transducer element, being characterized by programing of said computing device with a designated transfer function defined as the analog intermediate signal level as a function of the analog source signal level in conformance with a designated set of ALC performance specifications including an attack time, a release time and with the transfer function relating a level of received input to a resultant attenuation, thus rendering said analog amplifier to become an ALC amplifier with an analog signal path throughout and digitally stabilized ALC performance conforming to the specifications.

2. The digitized ALC transducer-calibrator defined in claim 1 wherein the designated set of ALC performance specifications include a primary set of ALC parameters, including:
    attack time: initial surge with attenuation increasing from normal,
    release time: decreasing following the surge with the attenuation decreasing back toward normal and
    transducer transfer function relating level of the analog source signal to resultant amount of attenuation of analog intermediate signal level.

3. The digitized ALC transducer-calibrator defined in claim 2 further comprising:
    at least one additional set of ALC specifications programed into said computing device; and
    a user switch enabling selection of a set of specifications from plural sets thereof for operation of said ALC system.

4. The digitized ALC transducer-calibrator defined in claim 2 wherein ALC circuitry is designed and programed to perform ALC in a limiter mode.

5. The digitized ALC transducer-calibrator defined in claim 4 wherein said ALC further comprises:
    ALC circuitry and programing enabling alternative ALC performance in a compressor mode; and
    a mode control enabling user-selection between the limiter mode, compressor mode, or both.

6. The digitized ALC transducer-calibrator defined in claim 1 further comprising appropriate terminals and programming upgrade, to connect to any external ALC system and perform as a test equipment setup for ALC evaluation and calibration thereof.

7. The digitized ALC transducer-calibrator defined in claim 1 deployed as an ALC calibrator, for calibrating circuitry of an ALC loop stage driven from a signal input stage and driving a main amplifier, the ALC calibrator comprising:
    said computing device programed with at least a primary set of ALC performance specifications including key parameters to be calibrated, each defined, within a working range, by a corresponding data lookup table and formula information as required;
    a calibration signal generator capable of generating an ALC performance calibration input signal; and
    a RUN-CALIBRATE switch function, controlled by said computing device, made and arranged to select between an external input signal input and the calibration input signal.

8. The ALC calibrator defined in claim 7 wherein the received analog signal is an audio signal and the performance parameters include:
    attack time relating increasing attenuation to time,
    release time relating decreasing attenuation to time, and
    transducer transfer function relating level of received input to resultant attenuation.

9. The ALC calibrator defined in claim 8 further comprising:
    at least one additional set of ALC specifications programmed into said computing device; and
    a user switch enabling selection of a set of specifications from plural sets thereof for operation of said ALC calibrator.

10. The ALC calibrator defined in claim 7 wherein ALC circuitry is designed and programmed to perform ALC calibration of ALC systems operating in a limiter mode, ALC systems operating in a compressor mode, and ALC systems operating in a combined limiting/compressing mode.

11. The ALC calibrator as defined in claim 7 further comprising appropriate terminals and programing upgrade as required to connect to any external ALC system and to perform as a test equipment setup for ALC evaluation and calibration thereof.

12. The ALC calibrator as defined in claim 1 in combination with a professional audio ALC amplifier having a purely analog signal path throughout and having a highly stable digitized SLT (Signal Level Transducer), in its ALC loop stage, said ALC amplifier comprising:

a computing device, selected from a group including a microprocessor, a microcontroller and a digital signal processor;

an ALC loop stage having (a) a purely analog attenuator branch including an analog ECA (Electronically Controlled Attenuator) driven from said preamplifier and driving an analog main audio output amplifier, and (b) a transducer branch, driven from said preamplifier, including the high stability SLT, digitally implemented by said computing device, delivering an analog control input to the ECA.

\* \* \* \* \*